(12) United States Patent
Kanouda et al.

(10) Patent No.: US 6,567,261 B2
(45) Date of Patent: May 20, 2003

(54) DC-DC STEP-DOWN CONVERTER WITH SUPER CAPACITOR

(75) Inventors: Akihiko Kanouda, Hitachinaka (JP); Kenichi Onda, Hitachi (JP); Norikazu Tokunaga, Hitachi (JP); Mikiya Nohara, Hitachinaka (JP); Ryouhei Saga, Takasaki (JP); Morinobu Endo, Suzaka (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/212,700

(22) Filed: Aug. 7, 2002

(65) Prior Publication Data

US 2003/0039092 A1 Feb. 27, 2003

Related U.S. Application Data

(63) Continuation of application No. 10/100,186, filed on Mar. 19, 2002.

(30) Foreign Application Priority Data

Aug. 27, 2001 (JP) ........................................ 2001-255419

(51) Int. Cl.$^7$ ................................................. H01G 9/00
(52) U.S. Cl. .................... 361/502; 363/21.06; 363/21.1; 363/21.07

(58) Field of Search ................................. 323/272, 282, 323/284, 288, 285; 363/26, 89, 134, 128, 21.04, 21.06, 21.1, 21.07; 320/167; 361/502

(56) References Cited

U.S. PATENT DOCUMENTS 5,982,156 A * 11/1999 Weimer et al. ............. 323/222
6,081,434 A * 6/2000 Kinoshita et al. ............. 363/24

FOREIGN PATENT DOCUMENTS

JP 8-242577 9/1996

* cited by examiner

*Primary Examiner*—Shawn Riley
(74) *Attorney, Agent, or Firm*—McDermott, Will & Emery

(57) ABSTRACT

A voltage regulator module includes a power supply circuit for supplying power to an integrated circuit, the power supply circuit including semiconductor switching devices and a drive circuit for driving the semiconductor switching devices; and charge storage means for smoothing an output of the power supply circuit, wherein charge storage unit having a smoothing capacitor includes an electric double-layer capacitor, wherein the electric double-layer capacitor includes a plurality of positive electrodes terminals and a plurality of negative electrode terminals, and wherein the plurality of positive electrode terminals and the plurality of negative electrode terminals are disposed on a surface identical to a surface of the electric double-layer capacitor.

6 Claims, 10 Drawing Sheets

DC-DC STEP-DOWN CONVERTER WITH SUPER CAPACITOR

This application is a continuation of application Ser. No. 10/100,186 filed Mar. 19, 2002.

BACKGROUND OF THE INVENTION

The present invention relates to a voltage regulator module for supplying power to a microprocessor and a CPU.

Conventionally, as a circuit configuration of a VRM (Voltage Regulator Module), which is power supply for supplying power to a computer microprocessor or a large scale integrated circuit called CPU (Central Processing Unit), a multi-phase shift converter system has been proposed and has become popular. As an example thereof, JP-A-8-242577, "switching regulator" can be mentioned.

In the CPU, with the fine process advanced for a purpose of enhancing the processing performance, the core voltage has lowered to approximately 1.5 to 1.0 V. On the other hand, due to an increase in the number of transistors simultaneously used for computation operation by parallel processing software, the current composition has increased to several tens to 100 A. Furthermore, according to contents of computation in the CPU, the current consumption changes momentarily and its current change rate (di/dt) becomes extremely as large as 300 to 1000 A/$\mu$s. Therefore, a low voltage, a large current, and a high current change rate responsibility are required of the VRM, which supplies power to the CPU.

A conventional technique for coping with the request is the multi-phase shift converter system. A VRM of this system will now be described by referring to FIG. 11. In FIG. 11, reference numeral 20 denotes a DC (direct current) power source 21a, 21b, 22a and 22b power MOSFETs, 23a and 23b smoothing coils, 24 a smoothing capacitor, 25 a load, 26a and 26b drive circuits, and 27 internal resistance of the capacitor. In the circuit of FIG. 11, power MOSFETs 21a and 22a are connected in series to the DC power source 20. A filter including the smoothing coil 23a connected to a connection point between the power MOSFET 21a and the power MOSFET 22a, and the smoothing capacitor 24 forms a step-down converter. The power MOSFET 21b, the power MOSFET 22b and the smoothing coil 23b are also connected in the same way. The smoothing coil 23a and the smoothing coil 23b are connected on the load side. Gates of the power MOSFET 21a and the power MOSFET 22a are connected to the drive circuit 26a. Gates of the power MOSFET 21b and the power MOSFET 22b are connected to the drive circuit 26b.

Operation of FIG. 11 will now be described. As described above, a low voltage, a large current, and a high di/dt response are demanded of the load CPU 25. For a steep load change, it is desirable to supply a current corresponding to high frequencies from the smoothing capacitor to the load. However, the internal resistor 27 of the capacitor exists in the smoothing capacitor 24, and its value is comparatively large. Therefore, di/dt of the CPU load cannot be coped with, and the load voltage varies. This results in false operation of the CPU 25.

In the VRM of the conventional technique, two or more converters are connected in parallel to improve the di/dt response of the current supplied from the converters. First, if the power MOSFET 21a turns on, a current flows from the DC power source 20 into the smoothing capacitor 24 through the smoothing coil 23a. If the power MOSFET 21a turns off and the power MOSFET 22a turns on, the current that has flown through the smoothing coil 23a flows in a source-drain direction of the power MOSFET 22a. On the other hand, the converter formed off the power MOSFETs 21b and 22b and the smoothing coil 23b also functions in the same way. If at this time the power MOSFET 21a and the power MOSFET 21b are made equal in switching frequency and deviated in switching phase by 180 degrees, then currents flowing through the smoothing coils 23a and 23b differ in phase by half the period. As compared with the case where only the MOSFETs 21a and 22a are activated, therefore, the ripple on the output current can be reduced to half. In the multi-phase shift converter system, it is thus attempted to obtain a high di/dt response by connecting n number of converters in parallel and shifting switching phases of the power MOSFETs of these converters 360°/n by 360°/n.

For obtaining a high di/dt response, however, two or more number of converters must be connected in parallel in the VRM of the conventional technique. It is possible to integrate power MOSFETs and the drive circuits. However, as many smoothing coils, which are difficult to be integrated, as the converters are needed. Therefore, the number of components is large, and the area of mounting becomes large. Furthermore, the conventional technique has a drawback that the cost also becomes high. Furthermore, if the distance between the converters and the load CPU becomes long, inductance of the wiring pattern increases and the change of the voltage caused by a change of the load current becomes non-negligible. In the conventional VRM having a large number of components, however, it is difficult to dispose the converters close by the load CPU.

SUMMARY OF THE INVENTION

An object of the present invention is to achieve a low voltage, a large current, and a high di/dt response in a voltage regulator module called VRM for supplying power to a CPU by mounting an electric double-layer capacitor having extremely low internal impedance close by the CPU.

In accordance with the present invention, a charge storage unit having at least two sets of positive electrode terminals ((+) terminals) and negative electrode terminals ((−) terminals) is provided as means for achieving the object. The charge storage unit is mounted and disposed in an internal region of a virtual globe having a length of a longer side of the load CPU as a radius thereof and the center of gravity of the load CPU as a center thereof.

The load as CPU is suitable for the case where it is activated by a clock frequency of at least 500 MHz, and the load CPU has a core voltage of 2 V or less, a rated current consumption of at least 50 A, and a current change rate of at least 150 A/$\mu$s. The number of (+) terminals may be equal to the number of (−) terminals. It is also effective to make the number of (+) terminals more than the number of (−) terminals by at least one, and use one of the (+) terminals to detect a voltage within the charge storage unit.

It is also effective as means for achieving the object to make the interval (pitch) of the (+) terminals and (−) terminals equal to the interval (pitch) of terminals of the integrated circuit and arrange the (+) terminals and (−) terminals alternately. In addition, from the viewpoint of component reduction and efficiency improvement, it is desirable that the voltage regulator module is a single-stage DC—DC converter that is supplied with a DC voltage of at least 13 V and that outputs a voltage of 2 V or less.

It is possible to mount the load CPU on an obverse side of a substrate and mount the charge storage unit on a reverse side of the substrate. It is also possible to mount the load CPU on the substrate in a silicon chip state, and mount the charge storage unit on the substrate. It is also possible that the length of a longer side of the charge storage unit is shorter than the length of a longer side of the integrated circuit, and a thickness of the charge storage unit exclusive of terminals is 6 mm or less. The charge storage unit can be implemented by an electric double-layer capacitor formed by mixing fine carbon fiber in active carbon, opposing graphite foils with the active carbon applied to one side thereof to each other, and interposing a separator impregnated with sulfuric acid between the graphite foils. It is desirable that the charge storage unit has a capacitance of at least 10 mF and an internal resistance of 1 m$\Omega$ or less.

Other objects, features and advantages of the invention will become apparent from the following description of the embodiments of the invention taken in conjunction with the accompanying drawings.

DESCRIPTION OF THE EMBODIMENTS

Figure 1:
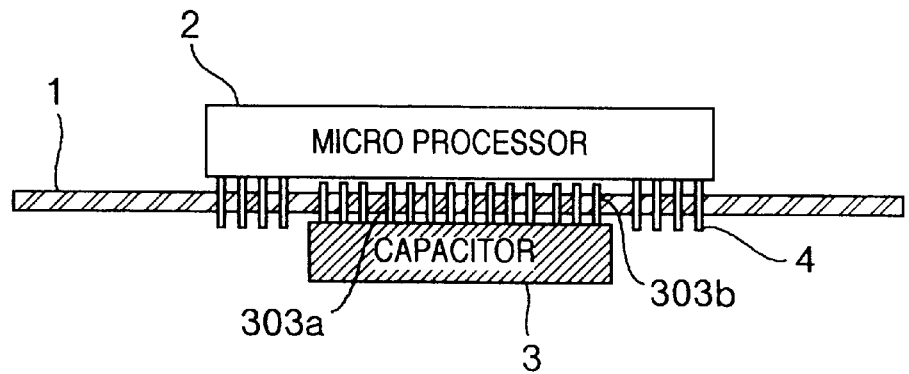
FIG. 1 is a mounting arrangement sectional view of a charge storage unit and a CPU that shows a first embodiment of the present invention.
Figure 2:
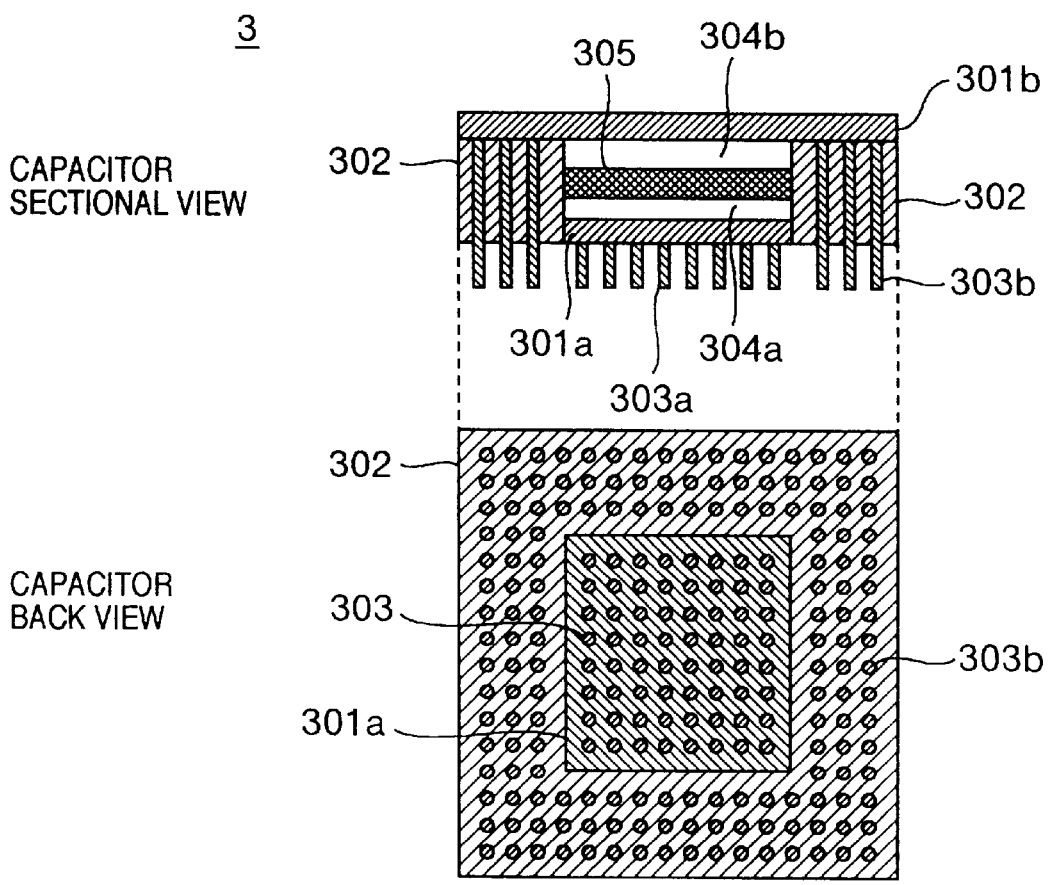
FIG. 2 is a sectional view and a back view of a charge storage unit that shows a first embodiment of the present invention.

A first embodiment of the present invention will now be described by referring to FIGS. 1, 2, 12 and 13. FIG. 1 is a diagram showing a basic configuration of the present invention. In FIG. 1, reference numeral 1 denotes a substrate, 2 a CPU package, 3 a charge storage unit, 4 a CPU terminal, 303a (+) terminal, and 303b (−) terminal. FIG. 2 is a diagram showing a sectional view and a back (terminal) view of the charge storage unit 3 shown in FIG. 1. The same components as those of FIG. 1 are denoted by like characters. In FIG. 2, 301a and 301b denote metal sheets, 302 a mold member, 304a and 304b electrode members, and 305 a separator.

In the sectional view of FIG. 2, each of the electrode members 304a and 304b is formed by applying active carbon to one side of graphite foil. In addition, fine carbon fiber is mixed into active carbon in order to reduce the internal impedance. The sides of the electrode members with active carbon applied thereto are opposed to each other via the separator 305. The separator 305 is a filter paper impregnated with sulfuric acid. The metal sheet 301a is brought into contact with the electrode member 304a and electrically connected thereto. The metal sheet 301b is brought into contact with the electrode member 304b and electrically connected thereto. A plurality of (+) terminals 303a are connected to the metal sheet 301a. In the same way, a plurality of (−) terminals 303b are connected to the metal sheet 301b. The mold member 302 is an insulation member. The mold member 302 covers and fixes the metal sheets 301a and 301b, the (+) terminals 303a, and the (−) terminals 303b. In the back view of FIG. 2, a plurality of (+) terminals 303a are arranged in its central portion so as to form a square, and a plurality of (−) terminals 303b are arranged around the (+) terminals.

As a result, the charge storage unit 3 becomes an electric double-layer capacitor. Its capacitance C and its internal resistance r can be made at least 1 mF and at most 0.1 m$\Omega$, respectively.

Figure 3:
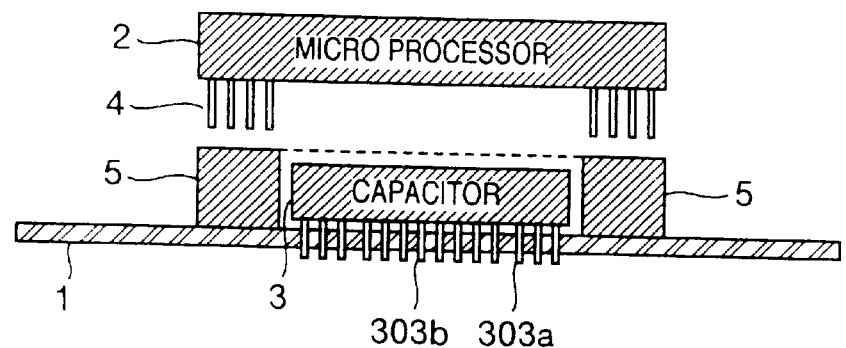
FIG. 3 is a sectional view of a mounting configuration of a charge storage unit and a CPU that shows a second embodiment of the present invention.

With reference to FIG. 1, the CPU package 2 has a plurality of CPU terminals 4, which are connected to the substrate 1. The CPU 2 is mounted on an A side of the substrate 1. The charge storage unit 3 shown in FIG. 3 is mounted on a B side of the substrate 1. The (+) terminals 303a and the (−) terminals 303b are connected to the substrate 1. The CPU has a core voltage of at most 2 V.

Figure 11:
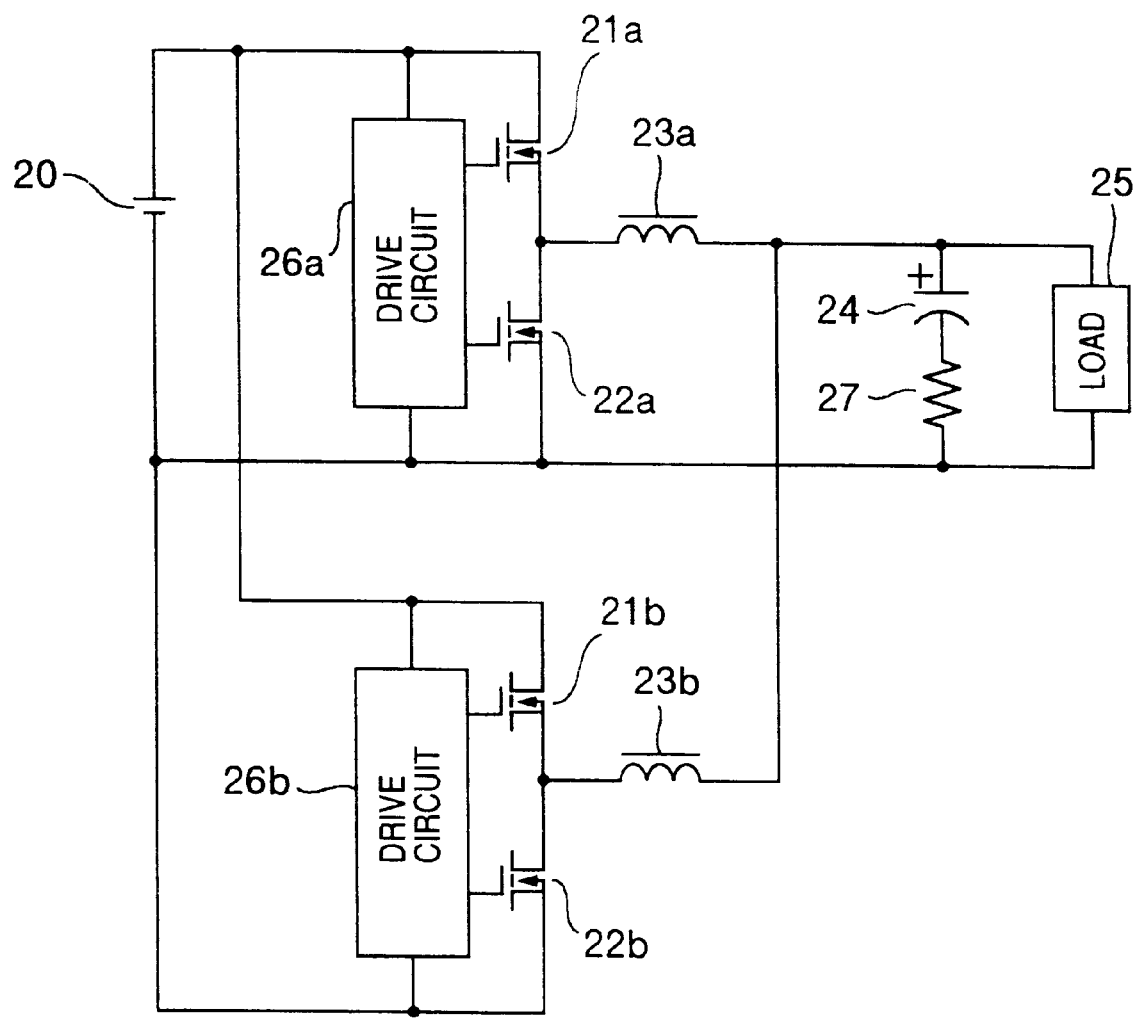
FIG. 11 is a circuit diagram showing a configuration of a VRM of a conventional technique.
Figure 12:
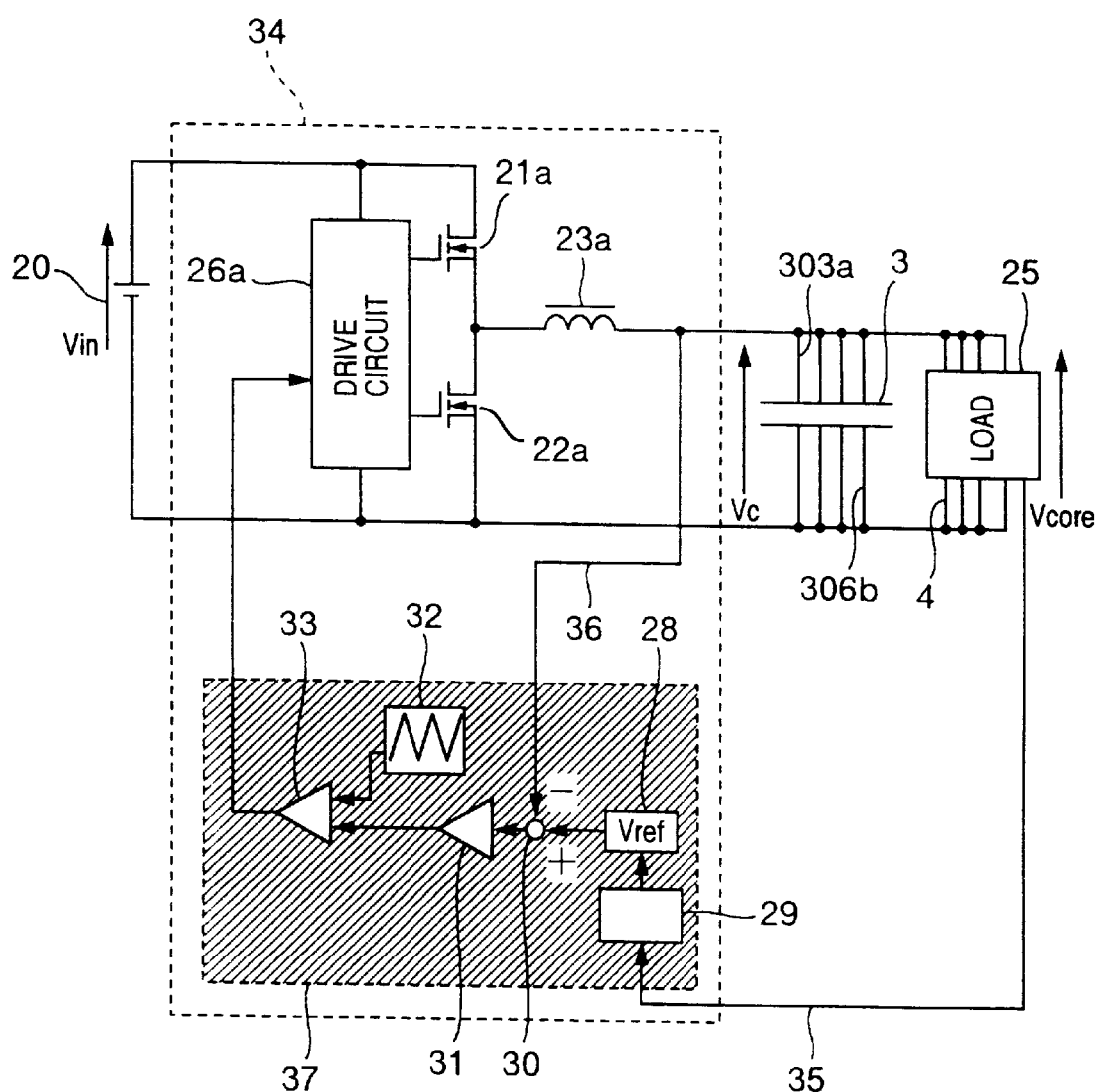
FIG. 12 is a circuit diagram of a VRM that shows a first embodiment of the present invention.

FIG. 12 is a circuit diagram of a VRM using the charge storage unit of the present invention. In FIG. 12, the same components as those of FIG. 1, 2 and 11. In addition, reference numeral 28 denotes a reference voltage generation unit, 29 a voltage order value alteration unit, 30 a subtracter, 31 an error amplifier, 32 a triangular wave generation unit, 33 a comparator, 34 a power supply circuit, 35 a voltage signal, 36 an output voltage feedback signal, and 37 a control circuit. In FIG. 12, power MOSFETs 21a and 22a are connected in series to the DC power source 20. A filter including a smoothing a coil 23a connected to a connection point between the power MOSFET 21a and the power MOSFET 22a, and a charge storage unit 3 forms a stepdown converter.

Figure 13:
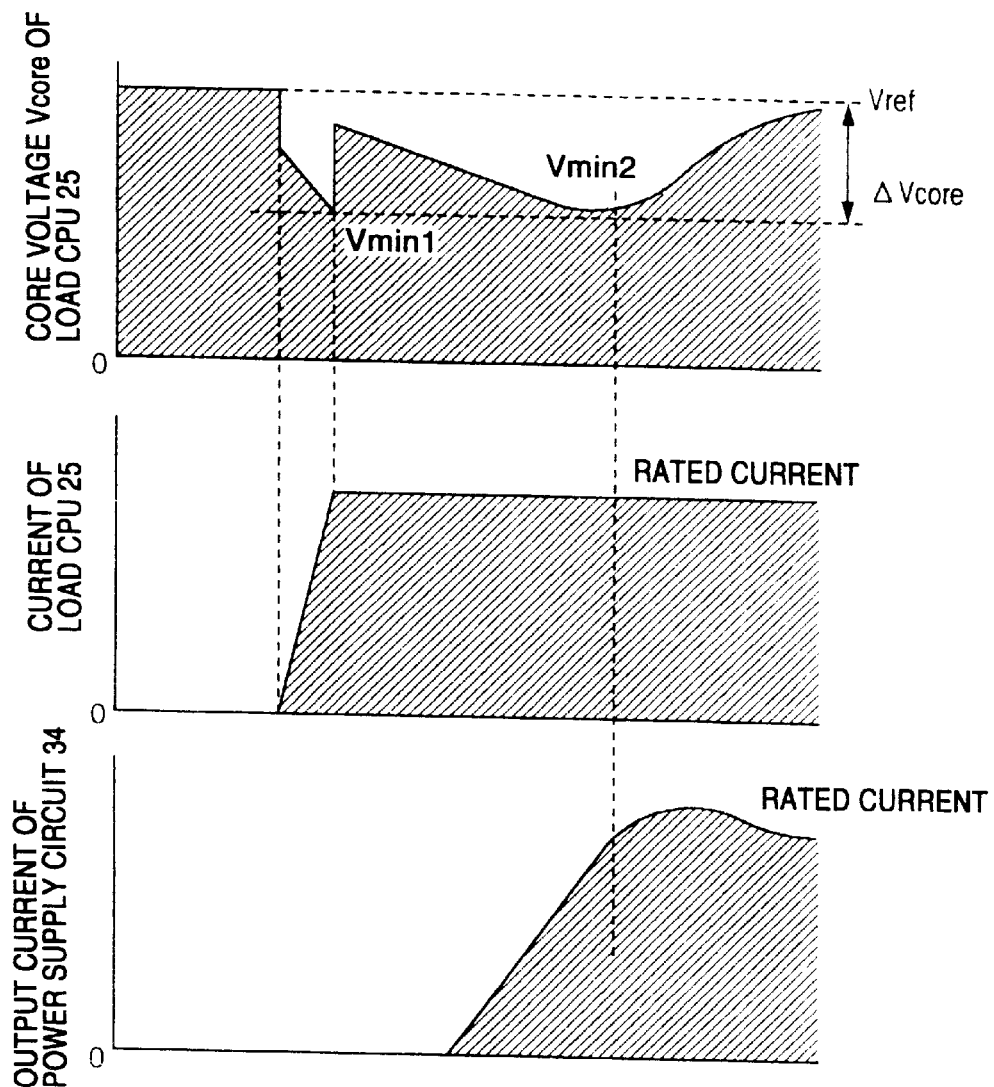
FIG. 13 is a waveform showing a relation between a CPU core voltage and a load current in a first embodiment of the present invention.

The charge storage unit 3 has (+) terminals 303a (−) terminals 303b. A load CPU 25 is connected between the (+) terminals 303a and (−) terminals 303b. Gates of the power MOSFET 21a and the power MOSFET 22a are connected to a drive circuit 26a. The output voltage feedback signal 36 is output from a connection point between the smoothing coil 23a and the charge storage unit 3, and input to a (−) input of the subtracter 30. On the other hand, an output of the reference voltage generation unit 28 is input to a (+) input of the subtracter 30. An output of the subtractor 30 is input to an error amplifier 31. An output of the error amplifier 31 is input to the comparator 33. An output of the triangular wave generation unit 32 is also input to the comparator 33. An output of the comparator 33 is input to the drive circuit 26a. The voltage order signal 35 is output from the load CPU 25, the input to the voltage order value alteration unit 29. An output of the voltage order value alteration unit 29 is input to the reference voltage generation unit 28. FIG. 13 shows approximate waveforms of a core voltage Vcore of the load CPU 25 shown in FIG. 12, a current of the load CPU 25, and an output current of the power supply circuit 34.

Operation in the present embodiment will now be described. If the power MOSFET 21a turns on in FIG. 12, a current flows from a DC power source 20 to the charge storage unit 3 and the load CPU 25 via the smoothing coil 23a. The charge storage unit 3 is thus charged. A current that flows through the smoothing coil 23a increases. If the power MOSFET 21a is turned off and the power MOSFET 22a is turned on at this time, the current that has flown through the smoothing coil 23a flows through a circuit formed of the power MOSFET 22a, the smoothing coil 23a and the charge storage unit 3. At this time as well, a current flows from the charge storage unit 3 to the load CPU 25.

Vout which is the voltage of the charge storage unit 3, is fed back by the output voltage feedback signal 36. This signal is input to the subtractor 30, and compared with a reference voltage of the reference voltage generation unit 28. A result of this subtraction is input to the error amplifier 31, and amplified. A triangular wave output from the triangular wave generation unit 32 is composed with an output of the error amplifier 31 in the comparator 33. The comparator 33 outputs a sequence of pulses corresponding to the error. This sequence of pulses is input to the drive circuit 26a to drive the power MOSFEt 21a and the power MOSFET 22a. This control system conducts PWM (pulse width modulation) control so as to increase the on-time ratio of the power MOSFET 21a when the output voltage Vout is lower than a reference voltage Vref and so as to decrease the on-time ratio of the power MOSFET 21a when the output voltage Vout is higher than the reference voltage Vref. As a result, the output voltage Vout is controlled so as to become the fixed value Vref irrespective of the current of the load CPU 25.

When altering the voltage of the CPU 25, the voltage order signal 35, which is a digital signal, is output. In the power supply circuit 34, the voltage order signal 35 input thereto is supplied to the voltage order value alteration unit 29. The voltage order value alteration unit 29 converts the voltage order signal 35 supplied from the load CPU 25 to an analog signal, and input to the reference voltage generation unit 28. As a result, the reference voltage Vref is altered, and the output voltage Vout is altered according to the requested value of the load CPU 25.

A plurality of (+) terminals 303a and a plurality of (−) terminals 303b are connected to a plurality of CPU terminals 4 of the load CPU 25. The current required by the load CPU 25 changes momentarily according to the contents of computation processing. According to the contents of the computation, therefore, the load current changes abruptly. Assuming now that the load current has changed from the state where the load current is nearly 0 to a rated load state, a required current is supplied from the charge storage unit 3 to the load CPU 25 via the plurality of (+) terminals 303a and the CPU terminals 4.

Denoting the total of inductance of terminals and wiring between the charge storage unit and the load CPU by 1, the voltage of the load CPU 25 by Vcore, the current consumption of the load CPU 25 by I, the voltage of the charge storage unit 3 by Vc, and an internal resistance of the charge storage unit 3 by r, the following expressions are satisfied.

$$Vcore = Vc + L \cdot di/dt + ir \quad (1)$$

$$i = C \cdot dVc/dt \quad (2)$$

It is now assumed that the load current rises from 0 to the rated current with constant di/dt as shown in FIG. 13. Considering that the internal resistance r of the charge storage unit 3 of the present invention is at most 0.1 mΩ, a voltage L·di/dt caused by the wiring inductance becomes dominant in the core voltage Vcore when the current is changing. A drop is caused by the internal resistance is added thereto. As a result, the core voltage Vcore temporarily drops to Vmini as represented by an illustrated waveform. When the load current has reached the rated current, the current change disappears and the drop caused by the wiring inductance becomes 0. Therefore, the core voltage Vcore once rises steeply. Thereafter, the core voltage Vcore decreases monotonously because of a drop (constant value) caused by the internal resistance r and a voltage drop of VC caused by discharge from the charge storage unit 3 and represented by the expression (2). Thereafter, the current supplied from the power supply circuit 34 is increased by feedback control applied to the power supply circuit 34. Therefore, the core voltage rises again from a minimum value Vmin2, and returns to the voltage reference value Vref.

For example, letting the output voltage Vcore be 1.0 V, a change ΔVcore of the core voltage be 5% or less, the rated current be 100 A, and the internal resistance r be 0.1 mΩ, and the load current rising from 0 to the rated current with di/dt equivalent to 350 A/μs as shown in FIG. 13, the following relation must be satisfied on the basis of expressions (1) and (2).

$$L \leq 100 \text{ pH} \quad (3)$$

For satisfying the condition of the wiring inductance L, however, the distance between the charge storage unit 3 and the CPU 25 needs to be made extremely short. In the present embodiment, therefore, the wiring inductance between the charge storage unit 3 and the CPU can be minimized by mounting the load CPU package 2 and the charge storage unit on the opposite sides of the substrate 1 as shown in FIG. 1.

Furthermore, contrivances for reducing the internal parasitic inductance and the internal resistance have been applied to the charge storage unit 3 itself. One of the contrivances is to equip the charge storage unit 3 with a large number of (+) terminals 303a and (−) terminals 303b as shown in FIG. 2 as a terminal configuration similar to that of the PGA (Pin Grid Array). As a result, both the internal resistance and the wiring inductance can be made far smaller than those of the conventional charge storage unit. In addition, it is also effective in reducing the internal resistance to apply active carbon on one side of graphite foil as the electrode members 304a and 304b and mix fine carbon fiber in active carbon. In addition, it is not found in the conventional charge storage unit to use sulfuric acid of low resistance as an electrolyte for impregnating the separator 305. It is a great feature of the present invention. In addition, it is also a feature that the charge storage unit 3 has a high heat radiation effect because the metal sheet 301 is exposed as shown in FIG. 2.

In the present embodiment of the present invention, the configuration of the power supply circuit 34 shown in FIG. 12 may be a different non-insulated or insulated DC—DC converter. Furthermore, it is also possible to use a different solution of low resistance as the electrolyte.

By using the charge storage unit 3 of the present invention, the laminated ceramic capacitor conventionally mounted and disposed near the CPU becomes unnecessary.

Figure 4:
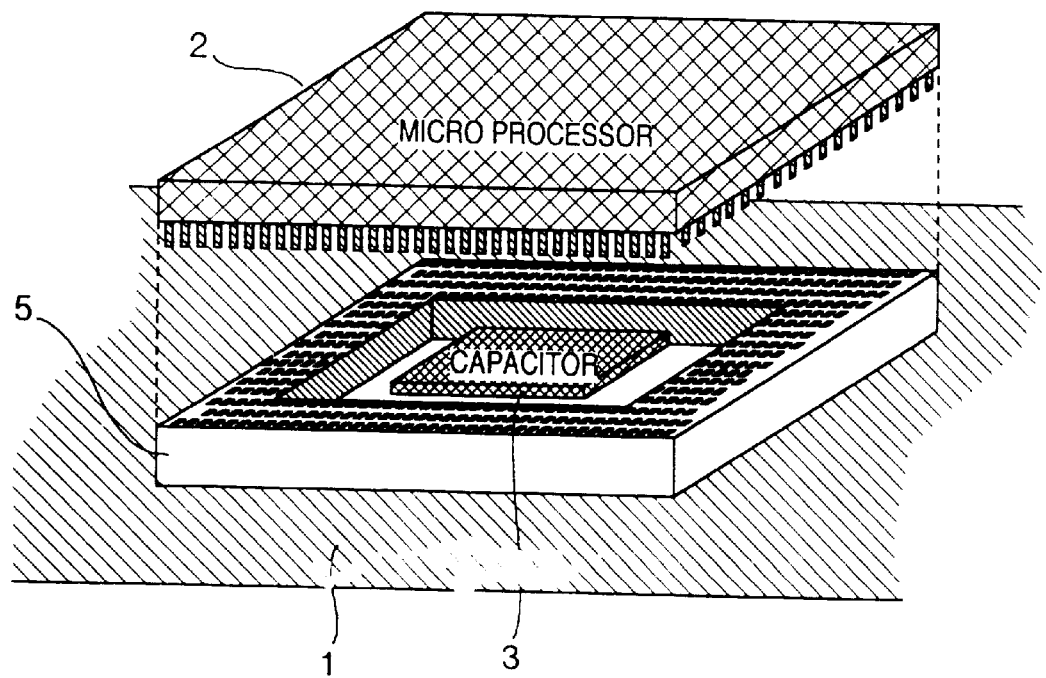
FIG. 4 is a view of a charge storage unit and a CPU taken from diagonally above a substrate that shows a second embodiment of the present invention.

A second embodiment of the present invention will now be described by referring to FIGS. 2, 3 and 4. In FIGS. 3 and 4, the same components as those of FIGS. 1 and 2 are denoted by like reference characters. Reference numeral 5 denotes a CPU socket.

In FIG. 3, a CPU package 2 is connected to the CPU socket 5 by CPU terminals 4. The CPU socket 5 is connected to a substrate 1. On the other hand, a charge storage unit 3 is connected to the substrate 1 by (+) terminals 303a and (−) terminals 303b.

FIG. 4 is a view of the configuration of FIG. 3 taken from diagonally above the substrate 1. In the present embodiment, the charge storage unit 3 is mounted and arranged in a hollow portion of a central portion of the socket 5. When the CPU package 2 is mounted on the socket 5, the charge storage unit 3 is hermetically sealed within the socket 5.

Operation of the present embodiment will now be described. In FIGS. 3 and 4, the charge storage unit 3 is mounted on the substrate 1, and the charge storage unit 3 functions as a voltage source for supplying power to the CPU package 2. If the current consumption is increased suddenly by an increase of computation processing contents of the CPU, therefore, the charge storage unit 3 supplies charge to make up a deficiency and the change of the core voltage of the CPU is confined to the minimum. Accordingly, it is not necessary to dispose a power supply for supplying power to the CPU close by the CPU package 2. In addition, a highly responsive power supply is not necessary, either. As a result, it is possible to dispose an input-output logic and a memory in an area of the substrate 1 around the CPU. The cost of the power supply can also be reduced.

Figure 5:
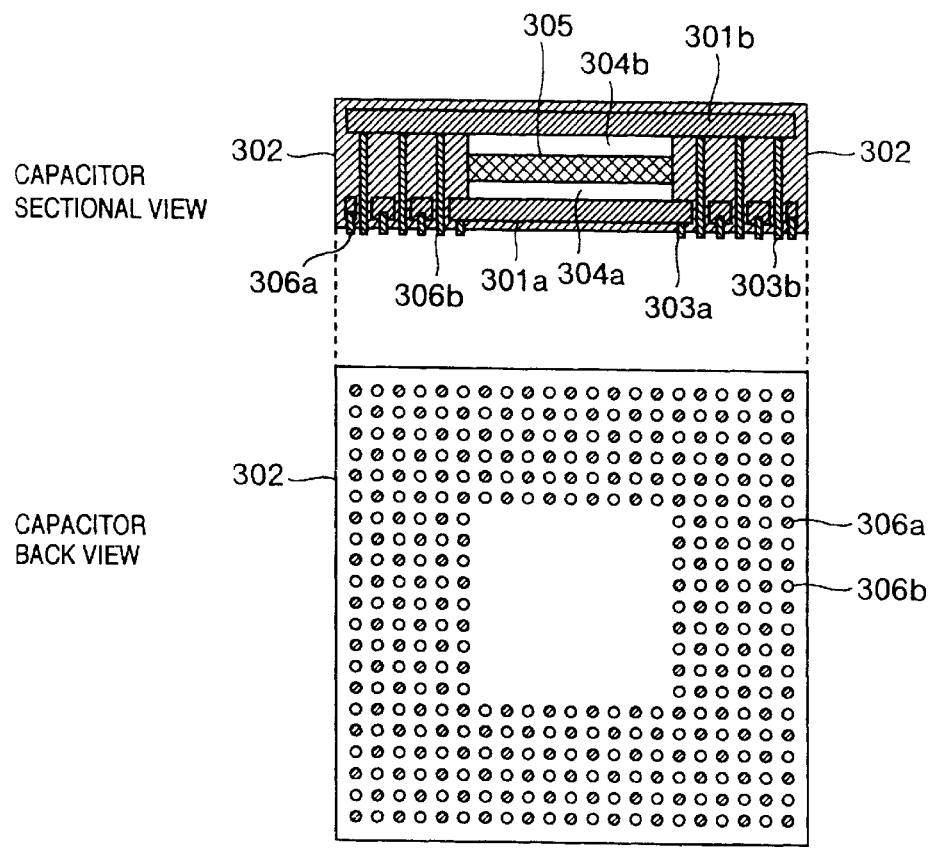
FIG. 5 is a sectional view and a back view of a charge storage unit that shows a third embodiment of the present invention.

A third embodiment of the present invention will now be described by referring to FIGS. 5 and 6. FIG. 5 is a diagram showing another structure of the charge storage unit 3 according to the present invention. In FIG. 5, the same components as those of FIGS. 1, 2, 3 and 4 are denoted by like reference characters. In FIG. 5, 306a and 306b denotes solder balls.

The configuration of FIG. 5 will now be described. In the sectional view of FIG. 5, electrode members 304a and 304b are formed by applying active carbon to one side of graphite foil. In addition, a fine carbon fiber is mixed in active carbon in order to reduce the internal impedance. The sides of the electrode members 304a and 304b with active carbon applied thereto are opposed to each other via a separator 305. The separator 305 is filter paper impregnated with sulfuric acid.

The metal sheet 301a is brought into contact with the electrode member 304a and electrically connected thereto. The metal sheet 301b is brought into contact with the electrode member 304b and electrically connected thereto. A large number of (+) terminals 303a are connected to the metal sheet 301a. In the same way, a large number of (−) terminals 303b are connected to the metal sheet 301b. The mold member 302 is an insulation member. The mold member 302 covers and fixes the metal sheets 301a and 301b, the (+) terminals 303a, and the (−) terminals 303b.

Furthermore, a solder ball (+) terminal 306a is connected to every (+) terminal 303a, and exposed from the back. In the same way, a solder ball (−) terminal 306b is connected to every (−) terminal 303b, and exposed from the back. In the back view of FIG. 5, therefore, a large number of solder ball (+) terminals 306a and 306b are disposed, resulting in an arrangement similar to the so-called BGA (Ball Grid Array). And the solder ball (+) terminals 306a, which are (+) electrodes, and the solder ball (−) terminals 306b, which are (−) electrodes, are disposed alternatively in both longitudinal and lateral directions.

Figure 6:
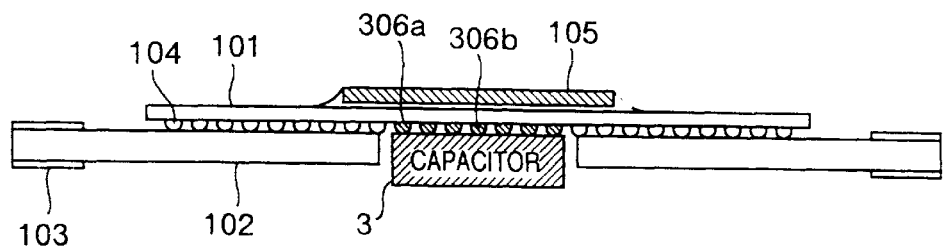
FIG. 6 is a mounting arrangement sectional view of a charge storage unit and a CPU core that shows a third embodiment of the present invention.

FIG. 6 will now be described. FIG. 6 is a sectional view showing mounting of a charge storage unit of the present invention on a CPU core. The same components as those of other drawings are denoted by like reference characters. In addition, in FIG. 6, reference numeral 101 denotes a CPU core substrate, 102 a CPU substrate, 103 a terminal, 104 a solder ball, and 105 a CPU core. In FIG. 6, the CPU core 105 is mounted on the CPU core substrate 101. All of input and output terminals of the CPU core 105 are electrically connected to the CPU core substrate 101. A large number of solder balls 104, which come in contact with the terminal, are disposed side by side on the back of the CPU core substrate 101. The solder balls 104 are connected to the CPU substrate 102. Solder ball (+) terminals 306a and solder ball (−) terminals 306b of the charge storage unit 3 are connected to the CPU core substrate 101.

Operation of the present embodiment will now be described. The CPU core 105 is typically a silicon chip called DIE. The CPU core 105 is electrically connected to the CPU core substrate 101. The charge storage unit 3 is connected to the back of the CPU core substrate 101 by the solder ball (+) terminals 306a. Power is supplied from the outside of the substrate 102 to the CPU core 105 and the charge storage unit 3 via the terminal 103. Therefore, the distance between a power supply terminal of the CPU core 105 and the charge storage unit 3 is extremely short, and the wiring inductance and wiring resistance between them can be suppressed to extremely low values. Furthermore, in the configuration of FIG. 6, heat can be released in a direction opposite to the charge storage unit 3 by disposing a radiation unit such as a radiation fin above the CPU core 105. Furthermore, the laminated ceramic capacitor conventionally disposed on the reverse (B side) of the CPU mounting side of the CPU substrate 102 is made unnecessary by mounting the charge storage unit 3 of the present invention.

Figure 7:
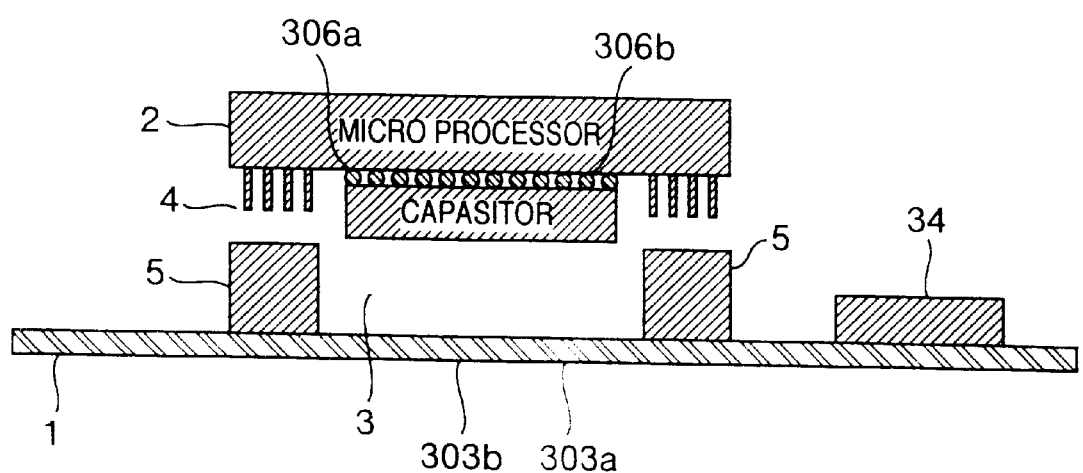
FIG. 7 is a mounting agreement sectional view of a charge storage unit and a CPU package that shows a fourth embodiment of the present invention.

A fourth embodiment of the present invention will now be described by referring to FIG. 7. In FIG. 7, the same components as those of other drawings are denoted by like reference characters. In FIG. 7, a CPU package 2 has terminals 4 and is connected to a socket 5. A charge storage unit 3 has a contour of BGA type described with reference to FIG. 5. The charge storage unit 3 is electrically connected to the CPU package 2 by solder ball (+) terminals 306a and solder ball (−) terminals 306b. A power supply circuit 34 for supplying power to the CPU package 2 is disposed on a substrate, and connected to the CPU package 2 via the socket 5.

Power consumed by the CPU package 2 is supplied from the power supply circuit 34. The charge storage unit 3 functions to smooth the supplied power. At the time of a load power change, charge stored by the charge storage unit 3 is used as the buffer. Even for a sudden load change, therefore, the core voltage can be stabilized. By using the charge storage unit 3 of the present invention, the laminated ceramic capacitor conventionally mounted and disposed near the socket 5 becomes unnecessary.

Figure 8:
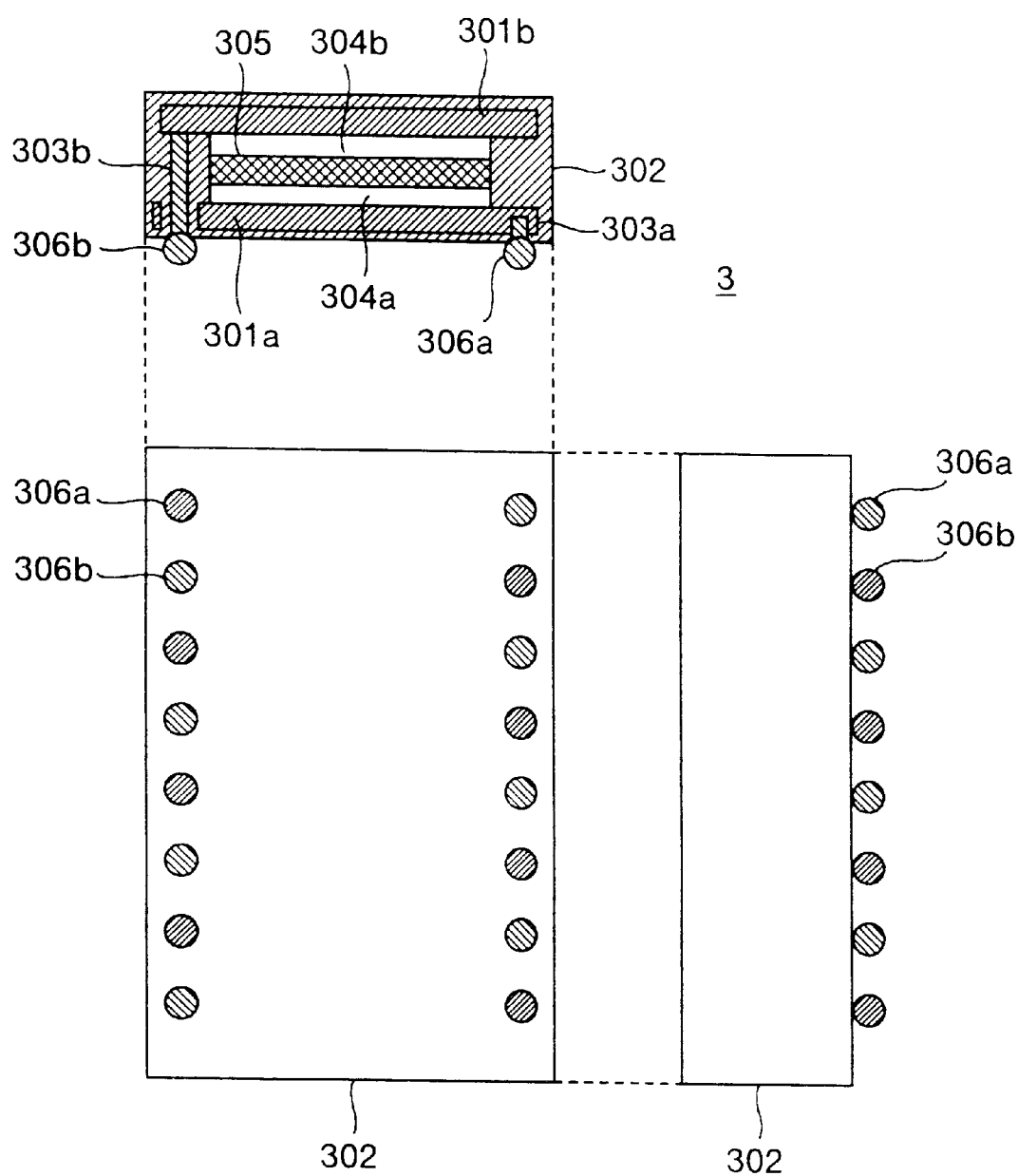
FIG. 8 is a sectional view and a back view of a charge storage unit that shows a fifth embodiment of the present invention.
Figure 9:
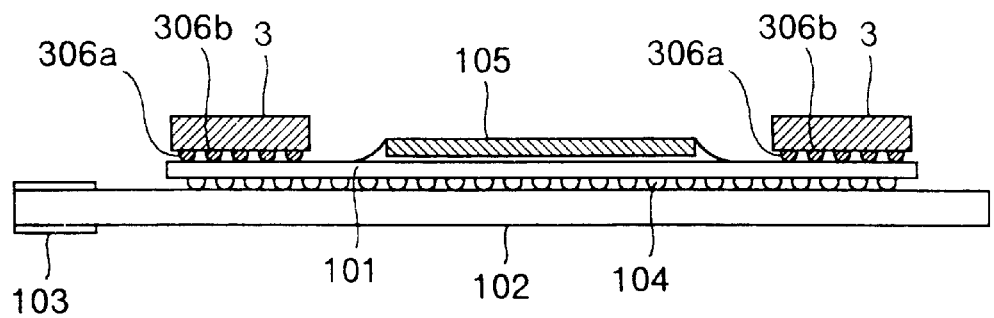
FIG. 9 is a mounting arrangement sectional view of a charge storage unit and a CPU core that shows a fifth embodiment of the present invention.
Figure 10:
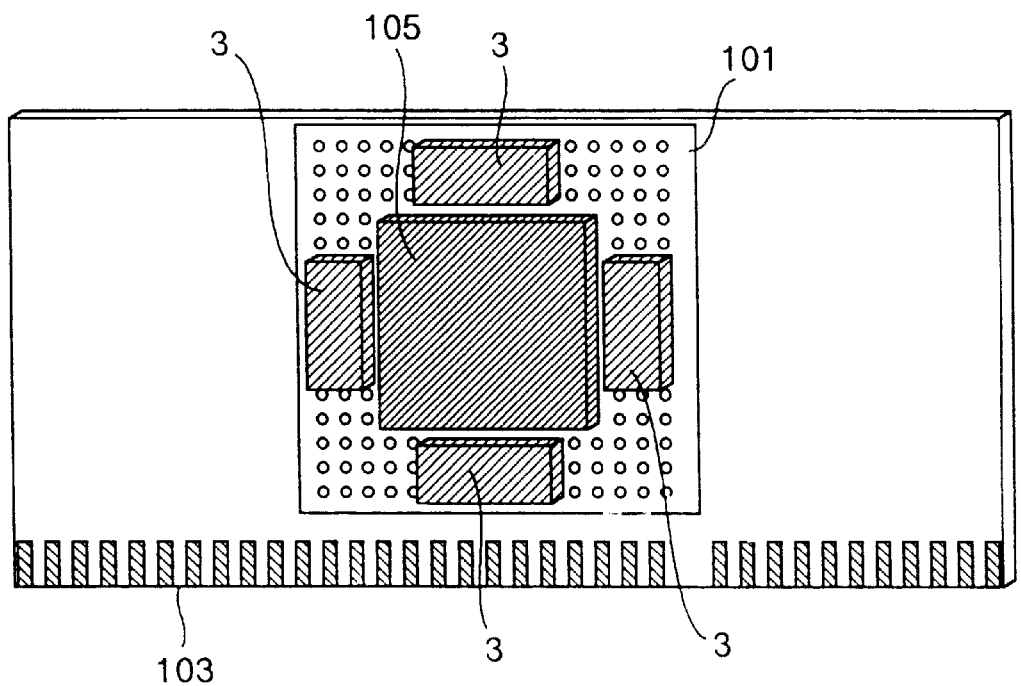
FIG. 10 is a mounting arrangement view of a charge storage unit and a CPU core that shows a fifth embodiment of the present invention.

A fifth embodiment of the present invention will now be described by referring to FIGS. 8, 9 and 10. In FIGS. 8, 9 and 10, the same components as those of other drawings are denoted by like reference characters.

In the sectional view of FIG. 8, each of electrode members 304a and 304b is formed by applying active carbon to one side of graphite foil. In addition, a fine carbon fiber is mixed in active carbon in order to reduce the internal impedance. The sides of the electrode members 304a and 304b with active carbon applied thereto are opposed to each other via a separator 305. The separator 305 is filter paper impregnated with sulfuric acid. The metal sheet 301a is brought into contact with the electrode member 304a and electrically connected thereto. The metal sheet 301b is brought into contact with the electrode member 304b and electrically connected thereto. A large number of (+) terminals 303a are connected to the metal sheet 301a. In the same way, a large number of (−) terminals 303b are connected to the metal sheet 301b. The mold member 302 is an insulation member. The mold member 302 covers and fixes the metal sheets 301a and 301b, the (+) terminals 303a, and the (−) terminals 303b. Furthermore, a solder ball (+) terminal 306a is connected to every (+) terminal 303a, and exposed from the back. In the same way, a solder ball (−) terminal 306b is connected to every (−) terminal 303b, and exposed from the back.

The charge storage unit 3 of FIG. 8 takes the shape of a rectangle when seen from the back (terminal side). A plurality of solder ball (+) terminals 306a and solder ball (−) terminals 306b are arranged in a straight line form in the lengthwise direction so that positive poles and negative poles will be disposed alternately.

FIG. 9 will now be described. FIG. 9 is a sectional view showing mounting of a charge storage unit 3 of the present invention on a CPU core. In FIG. 9, a CPU core 105 is mounted on a CPU core substrate 101. All of input and output terminals of the CPU core 105 are electrically connected to the CPU core substrate 101. A large number of solder balls 104, which come in contact with the terminal, are disposed side by side on the back of the CPU core substrate 101. The solder balls 104 are connected to the CPU substrate 102. Furthermore, a plurality of charge storage units 3 are mounted and arranged on the CPU core 105 mounting side of the CPU core substrate 101. Solder ball (+) terminals 306a serving as (+) terminals of the charge storage unit 3 and solder ball (−) terminals 306b serving as (−) terminals of the charge storage unit 3 are connected to the CPU core substrate 101.

FIG. 10 is an arrangement diagram of FIG. 9 taken from above the mounting side of the CPU core 105. The CPU core 105 is mounted and disposed in the central part of the CPU core substrate 101 taking the shape of a square. On the CPU core substrate 101, one charge storage unit 3 is mounted along each of four sides of the CPU core substrate 101. A total of four charge storage units 3 are mounted.

The present embodiment will now be described. A quantity corresponding to a change of the current consumption of the CPU core 105, which is the load, is supplied from these charge storage units 3. At this time, each charge storage unit 3 takes the shape of a rectangle as shown in FIG. 8, and (+) terminals and (−) terminals are disposed alternately. If a current flows from a charge storage unit 3 to the load CPU core 105 through a path including an electrode member 304a, the metal sheet 301a, a (+) terminal 303a, a solder ball (+) terminal 306a, the load CPU core 105, a solder ball (−) terminal 306b, a (−) terminal 303b, the metal sheet 301b and the electrode member 304b, then flux is generated around the current path in the charge storage unit 3. Since the (−) terminal 303b is adjacent to the (+) terminal 303a, however, the direction of the generated flux differs every terminal and fluxes are canceled each other. This results in an effect that the parasitic inductance component is reduced.

In the present embodiment, each of the charge storage units 3 has eight (+) terminals and eight (−) terminals, i.e., a total of 16 terminals. However, each of the charge storage units 3 may have a different number of terminals.

Figure 14:
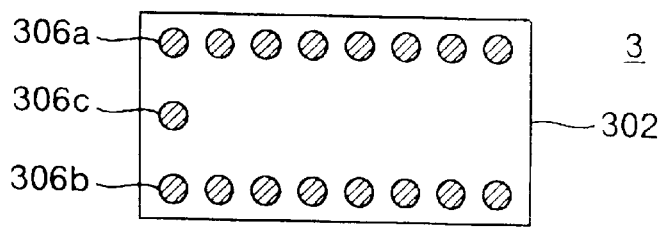
FIG. 14 is a back view of a charge storage unit that shows a sixth embodiment of the present invention.
Figure 15:
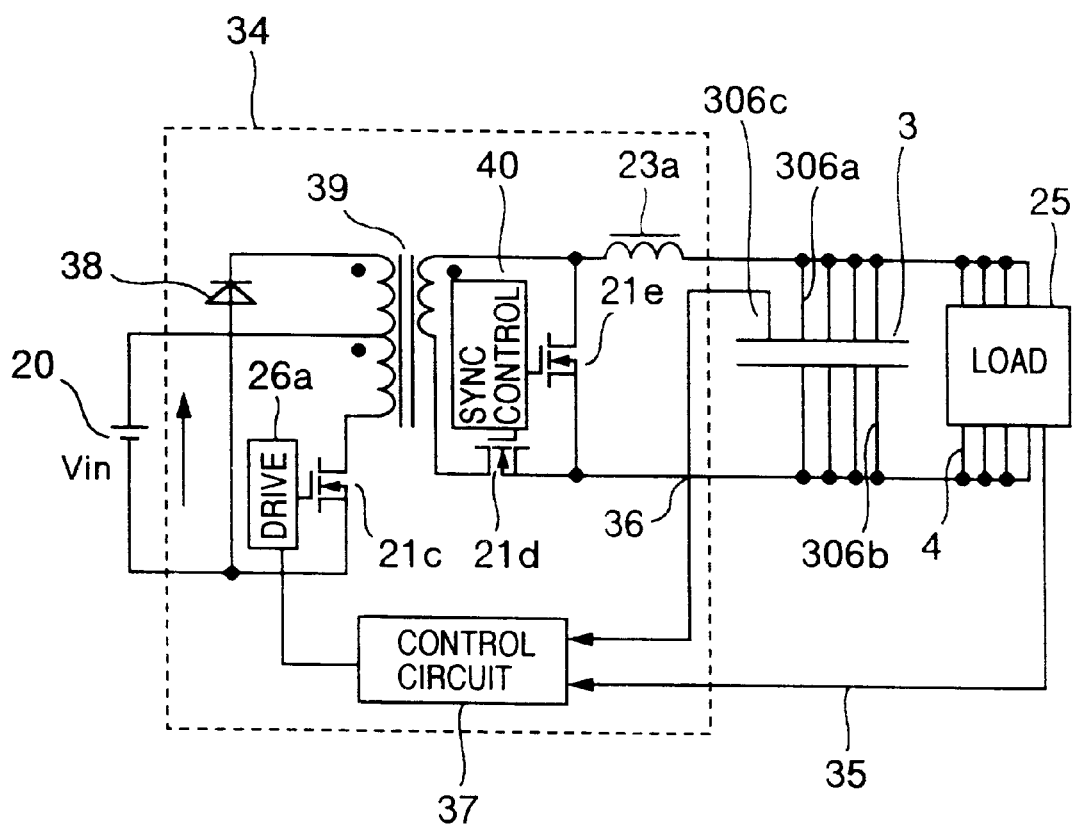
FIG. 15 is a circuit diagram of a VRM that shows a sixth embodiment of the present invention.

A sixth embodiment of the present invention will now be described by referring to FIGS. 14 and 15. In FIGS. 14 and 15, the same components as those of other drawings are denoted by like reference characters. In addition, in FIG. 14, 306c denotes a solder ball voltage detection terminal. In FIG. 15, reference numeral 38 denotes a diode, 39 a transformer, and 40 a synchronous rectification control circuit.

Each charge storage unit 3 shown in FIG. 14 has an internal structure that is almost the same as that shown in FIG. 8. In the same way as other solder ball (+) terminals 306a, the solder ball voltage detection terminal 306c is connected to the electrode member 304a via the metal sheet 301a shown in FIG. 8.

In FIG. 15, a (+) electrode of a DC power source 20 is connected to a center tap of the transformer 39. A terminal of a first input winding of the transformer 39 is connected to a power MOSFET 21c at its drain. The power MOSFET 21c is connected at its source to a (−) electrode of the DC power source 20. The diode 38 is connected at its cathode to a terminal of a reset winding, which is a second input winding of the transformer. The diode 38 is connected at its anode to the (−) electrode of the DC power source 20. The power MOSFET 21c is connected at its gate to a drive circuit 26a.

A smoothing coil 23a is connected at its first electrode to a first terminal of a secondary winding of the transformer. A power MOSFET 21d is connected at its drain to a second terminal of the secondary winding of the transformer. A power MOSFET 21e is connected at its drain to a connection point between the secondary winding of the transformer and the smoothing coil 23a. Sources of the power MOSFET 21e and the power MOSFET 21d are connected together and connected to solder ball (−) terminals 306b, which are (−) terminals of the charge storage unit 3.

A second electrode of the smoothing coil 23a is connected to solder ball (+) terminals 306a, which are (+) terminals of the charge storage unit 3. Tterminals 4 of a load CPU 25 are connected between the solder ball (+) terminals 306a and the solder ball (−) terminals 306b. A signal on the solder ball voltage detection terminal 306c is input to a power supply circuit 34 as an output voltage feedback signal 36, and input to a control circuit 37. A voltage order signal 35 from a load CPU 25 is also input to the control circuit 37. An output of the control circuit 37 is supplied to the drive circuit 26a. Gates of the power MOSFET 21e and the power MOSFET 21d are connected to the synchronous rectification control circuit 40.

Operation of the circuit shown in FIG. 15 will now be described. If the power MOSFET 21c turns on, the voltage of the DC power source 20 is applied to the input winding of the transformer 39. The DC power source 20 has a voltage of 48 V. At this time, a voltage depending on the turn member ratio of the transformer is output across the secondary winding. When the voltage at the connection point between a first terminal of the secondary winding terminal and the power MOSFET 21e is higher than the voltage at the connection point between a second terminal of the secondary winding terminal and the power MOSFET 21d, the synchronous rectification control circuit 40 functions to turn on the power MOSFET 21d and turn off the power MOSFET 21e.

Therefore, a current flows through a closed circuit formed of the secondary winding of the transformer, the smoothing coil 23a, the charge storage unit 3, and the power MOSFET 21d. The charge storage unit 3 is thus charged. Subsequently, if the power MOSFET 21c turns off, a current flows through a closed circuit of the primary winding side formed of the reset winding, the DC power source 20, and the diode 38. As a result, the transformer is reset. On the other hand, at this time, the voltage at the connection point between the first terminal of the secondary winding terminal and the power MOSFET 21e becomes lower than the voltage at the connection point between the second terminal of the secondary winding terminal and the power MOSFET 21d. Therefore, the synchronous rectification control circuit 40 functions to turn off the power MOSFET 21d and turn on the power MOSFET 21e. Accordingly, the current that has flown through the smoothing coil 23a flows through a path formed of the smoothing coil 23a, the charge storage unit 3, and the power MOSFET 21e.

Unlike other solder ball (+) terminals 306a, the solder ball voltage detection terminal 306c of the charge storage unit 3 is not connected directly to the load CPU 25, but input to the power supply circuit 34 as the output voltage feedback signal 36 and input to the control circuit 37. By using the output voltage feedback signal 36, the control circuit 37 controls the on-time ratio of the power MOSFET 21c so as to make the voltage of the charge storage unit 3 constant. The control circuit 37 has a configuration similar to that of the circuit shown in FIG. 12.

In the present embodiment of the present invention, the terminal dedicated to voltage detection, which is not connected directly to the power supply circuit or load, but which is connected to the feedback circuit, is provided in the charge storage unit as shown in FIGS. 14 and 15. As a result, an error of voltage detection precision caused by a change of the load current is eliminated, and accurate voltage detection becomes possible.

Furthermore, the core voltage of the load CPU is in a range of approximately 1 to 1.6 V. In the case of a DC power supply supplied with 48 V as its input, voltage step-down from 48 V to a DC voltage of approximately 12 V to 5 V is conducted by a DC—DC converter as shown in FIG. 15, and a voltage in the range of approximately 1 to 1.6 V, which is the core voltage of the CPU, is generated by a VRM, In the conventional technique. The reason will now be described. If the voltage difference between the input and the output is large, then a DC—DC converter of non-insulation type as shown in FIG. 12 cannot be used and there is no alternative but adopt the technique of conducting step-down by using a transformer. In the case of a DC—DC converter using a transformer, however, a sufficiently fast response cannot be obtained for a current change of the CPU.

On the other hand, in the present embodiment, the charge storage unit 3 supplies charge to the load to make up a deficiency in response to a current change of the load CPU. Even if the current change of the CPU is as fast as approximately 350 A/µs, therefore, the response of the power supply needs only be in the range of 10 to 50 A/µs in the same way as the conventional power supply. As a result, it becomes possible to generate a voltage in the range of approximately 1 to 1.6 V from 48 V by using the single-stage converter as shown in FIG. 15 and supply the voltage to the load CPU. As its effects, great merits such as reduction of the number of components owing to reduction of the number of serial stages of the converter, cost reduction, space saving, and efficiency improvement can be mentioned.

In the present embodiment, a DC—DC converter of one transistor forward type is illustrated as the power supply circuit. However, the circuit may have a different configuration.

By using the present invention, the conventional parallel converter becomes unnecessary. In addition, the control responsibility of the converter needs only be the conventional performance. Therefore, a higher switching frequency of the VRM becomes indispensable. An optimum design with due regard to the volume of the smoothing coil and the circuit loss becomes possible, resulting in a high efficiency. In addition, as described with reference to the sixth embodiment, the number of serial stages can be reduced by outputting a voltage of 2 V or less, which is the core voltage of the load CPU, directly from 48 V by using a single stage DC—DC converter. This results in great merits such as reduction of the number of components, cost reduction, space saving, and efficiency improvement.

It should be further understood by those skilled in the art that the foregoing description has been made on embodiments of the invention and that various changes and modifications may be made in the invention without departing from the spirit of the invention and the scope of the appended claims.

What is claimed is:

1. A DC—DC step-down converter including a plurality of power MOSFETs, a drive circuit for supplying a drive signal to control electrodes of said plurality of power MOSFETs to drive said power MOSFETs, a smoothing coil connected at one end to a connection point of said power MOSFETs, and a charge storage device connected to an other end of said smoothing coil, comprising:

a control circuit for producing a control signal for said drive circuit in accordance with a difference between a reference voltage and a voltage of a connection point of said smoothing coil and said charge storage device; wherein said smoothing coil includes an electric double-layer capacitor having a plurality of positive electrode terminals and a plurality of negative electrode terminals, and said plurality of positive and negative-electrode terminals are disposed on a surface identical to a surface of said electric double-layer capacitor.

2. A DC—DC step-down converter according to claim 1, wherein at least one of said power MOSFETs is controlled with a pulse width modulation by said control circuit.

3. A DC—DC step-down converter according to claim 1, wherein an output voltage of said step-down converter is equal to or less than 2 volts.

4. A DC—DC step-down converter according to claim 1, wherein the reference voltage of said control circuit is altered in accordance with a voltage indication signal from a central processing unit as a load.

5. A DC—DC step-down converter according to claim 1, wherein:

number of said positive electrode terminals on said electric double-layer capacitor is greater at least by one than number of said negative electrode terminals on said double-layer capacitor, and one of said positive electrode terminals is connected to said control circuit.

6. A DC—DC step-down converter according to claim 1, wherein:

number of said positive electrode terminals on said electric double-layer capacitor is equal to number of said negative electrode terminals on said electric double-layer capacitor, and said plurality of positive electrode terminals are disposed alternately with said plurality of negative electrode terminals.

* * * * *